United States Patent
Dickey et al.

(10) Patent No.: US 8,187,679 B2
(45) Date of Patent: May 29, 2012

(54) RADICAL-ENHANCED ATOMIC LAYER DEPOSITION SYSTEM AND METHOD

(75) Inventors: Eric R. Dickey, Portland, OR (US); William A. Barrow, Beaverton, OR (US)

(73) Assignee: Lotus Applied Technology, LLC, Hillsboro, OR (US)

( * ) Notice: Subject to any disclaimer, the term of this patent is extended or adjusted under 35 U.S.C. 154(b) by 744 days.

(21) Appl. No.: 11/829,050

(22) Filed: Jul. 26, 2007

(65) Prior Publication Data

US 2008/0026162 A1    Jan. 31, 2008

Related U.S. Application Data

(60) Provisional application No. 60/820,785, filed on Jul. 29, 2006.

(51) Int. Cl.
*H05H 1/24*   (2006.01)
(52) U.S. Cl. ..................................... 427/569
(58) Field of Classification Search ............... 427/569
See application file for complete search history.

(56) References Cited

U.S. PATENT DOCUMENTS

| | | |
|---|---|---|
| 4,058,430 A | 11/1977 | Suntola et al. |
| 4,389,973 A | 6/1983 | Suntola et al. |
| 5,256,205 A | 10/1993 | Schmitt, III et al. |
| 5,281,274 A | 1/1994 | Yoder |
| 5,338,362 A | 8/1994 | Imahashi |
| 5,462,602 A | 10/1995 | Misiano et al. |
| 5,514,217 A | 5/1996 | Niino et al. |
| 5,730,802 A | 3/1998 | Ishizumi et al. |
| 5,817,550 A | 10/1998 | Carey et al. |
| 5,879,519 A | 3/1999 | Seeser et al. |
| 6,037,002 A | 3/2000 | Hintermaier |
| 6,165,554 A | 12/2000 | Halpern et al. |
| 6,186,090 B1 | 2/2001 | Dotter, II et al. |

(Continued)

FOREIGN PATENT DOCUMENTS

EP    1641031 A2    3/2006

(Continued)

OTHER PUBLICATIONS

M. Creatore, V.I.T.A. Lohmann, M.A. Blauw and M.C.M. Van De Sanden, "Flexible Organic Electronics: The Role of Plasma Deposition in Mutli-Layer Permeation Barrier Technology," *49th Annual Technical Conference Proceedings of the Society of Vacuum Coaters*, pp. 143-146, 2006.

(Continued)

*Primary Examiner* — Kelly M Gambetta
(74) *Attorney, Agent, or Firm* — Stoel Rives LLP

(57) ABSTRACT

A radical-enhanced atomic layer deposition (REALD) system and method involves moving a substrate along a circulating or reciprocating transport path between zones that provide alternating exposure to a precursor gas and a gaseous radical species. The radical species may be generated in-situ within a reaction chamber by an excitation source such as plasma generator or ultraviolet radiation (UV), for example. The gaseous radical species is maintained in a radicals zone within the reaction chamber while a precursor gas is introduced into a precursor zone. The precursor zone is spaced apart from the radicals zone to define a radical deactivation zone therebetween. Purge gas flowing through the various zones may provide flow and pressure conditions that substantially prevent the precursor gas from flowing into the radicals zone. In some embodiments, the system includes a partition having one or more flow-restricting passageways though which the substrate is transported.

20 Claims, 4 Drawing Sheets

U.S. PATENT DOCUMENTS

| | | | |
|---|---|---|---|
| 6,200,893 B1 | 3/2001 | Sneh | |
| 6,319,553 B1 | 11/2001 | McInerney et al. | |
| 6,576,053 B1 | 6/2003 | Kim et al. | |
| 6,576,062 B2 | 6/2003 | Matsuse | |
| 6,616,986 B2 | 9/2003 | Sherman | |
| 6,620,288 B2 | 9/2003 | Shinohara et al. | |
| 6,634,314 B2 | 10/2003 | Hwang et al. | |
| 6,656,284 B1 | 12/2003 | Hwang et al. | |
| 6,752,869 B2 | 6/2004 | Lee et al. | |
| 6,764,546 B2 | 7/2004 | Raaijmakers | |
| 6,794,220 B2 | 9/2004 | Hirai et al. | |
| 6,797,337 B2 | 9/2004 | Dando et al. | |
| 6,812,157 B1 | 11/2004 | Gadgil | |
| 6,820,570 B2 | 11/2004 | Kilpela et al. | |
| 6,821,563 B2 | 11/2004 | Yudovsky | |
| 6,827,789 B2 | 12/2004 | Lee et al. | |
| 6,884,299 B2 | 4/2005 | Chang et al. | |
| 6,888,172 B2 | 5/2005 | Ghosh | |
| 6,932,871 B2 * | 8/2005 | Chang et al. | 118/719 |
| 7,070,658 B2 | 7/2006 | Guido et al. | |
| 7,074,719 B2 | 7/2006 | Kim et al. | |
| 7,323,231 B2 | 1/2008 | Derderian | |
| 7,361,387 B2 | 4/2008 | Nguyen | |
| 2002/0043216 A1 | 4/2002 | Hwang et al. | |
| 2002/0170496 A1 | 11/2002 | Ha et al. | |
| 2003/0089308 A1 * | 5/2003 | Raaijmakers | 117/200 |
| 2004/0224504 A1 * | 11/2004 | Gadgil | 438/680 |
| 2004/0261703 A1 | 12/2004 | Kobrin et al. | |
| 2005/0016453 A1 | 1/2005 | Seidel et al. | |
| 2005/0175789 A1 | 8/2005 | Helms, Jr. et al. | |
| 2006/0068519 A1 | 3/2006 | Dunbar et al. | |
| 2006/0228897 A1 * | 10/2006 | Timans | 438/758 |
| 2007/0111545 A1 | 5/2007 | Lee et al. | |
| 2007/0224348 A1 | 9/2007 | Dickey et al. | |
| 2007/0281089 A1 | 12/2007 | Heller et al. | |
| 2008/0092814 A1 | 4/2008 | Yan et al. | |
| 2008/0107825 A1 | 5/2008 | Ishizaka et al. | |
| 2008/0138539 A1 | 6/2008 | Breitung et al. | |

FOREIGN PATENT DOCUMENTS

| | | |
|---|---|---|
| JP | 05-078818 | 3/1993 |
| KR | 10-2004-0035083 A | 4/2004 |
| WO | WO 00/08899 | 2/2000 |
| WO | WO 2006/088463 A1 | 8/2006 |

OTHER PUBLICATIONS

A.W. Smith, N. Copeland, D. Gerrerd and D. Nicholas, "PECVD of $SiO_x$ Barrier Films," *45th Annual Technical Conference Proceedings of the Society of Vacuum Coaters*, pp. 525-529, 2002.

M. George, P. Morse, and J. Madocks, "High Barrier Transparent Coatings on Web by New Plasma Enhanced Chemical Vapor Deposition Process," *50th Annual Technical Conference Proceedings of the Society of Vacuum Coaters*, pp. 715-718, 2007.

N. Schiller, S. Straach, S. Günther, A. Quiceno, A. Contreras, R. Ludwig and G. Hoffmann, "Innovative Clear Barrier Technology for the Packaging Industry," Proceedings of the Fall Conference of the Association of Industrial Metallizers, Coaters and Laminators (AIMCAL), 2008.

International Search Report for International Patent Application No. PCT/US2007/074521, dated Jan. 28, 2008, 1 page.

U.S. Appl. No. 11/691,421, filed Mar. 26, 2007.

S.M. Bedair, Atomic layer epitaxy deposition processes, J. Vac. Sci. Technol. B, v.12, No. 1, pp. 179-185, Jan./Feb. 1994.

Keunjun Kim et al., Characteristics of Cobalt Thin Films Deposited by Remote Plasma ALD Method and Dicobalt Octacarbonyl, J. Electrochem. Soc., v. 154, No. 3, pp. H177-H181, Jan. 2007.

E. Langereis, S.B.S. Heil, M. Creatore, M.C.M. Van De Sanden and W.M.M. Kessels, "Plasma-Assisted Atomic Layer Deposition of $Al_2O_3$ on Polymers," *49th Annual Technical Conference Proceedings of the Society of Vacuum Coaters*, pp. 151-154, 2006.

Erlat et al., Ultra-high Barrier Coatings on Polymer Substrates for Flexible Optoelectronics: Water Vapor Transport and Measurement Systems, 47th Ann. Tech. Conf. Proc., pp. 654-659, Society of Vacuum Coaters, Apr. 2004, 6 pages.

U.S. Appl. No. 11/691,421, Office action dated Feb. 23, 2011.

Korean Intellectual Property Office, International Search Report and Written Opinion, International Patent Application No. PCT/US2011/045049, dated Feb. 22, 2012, 11 pages.

* cited by examiner

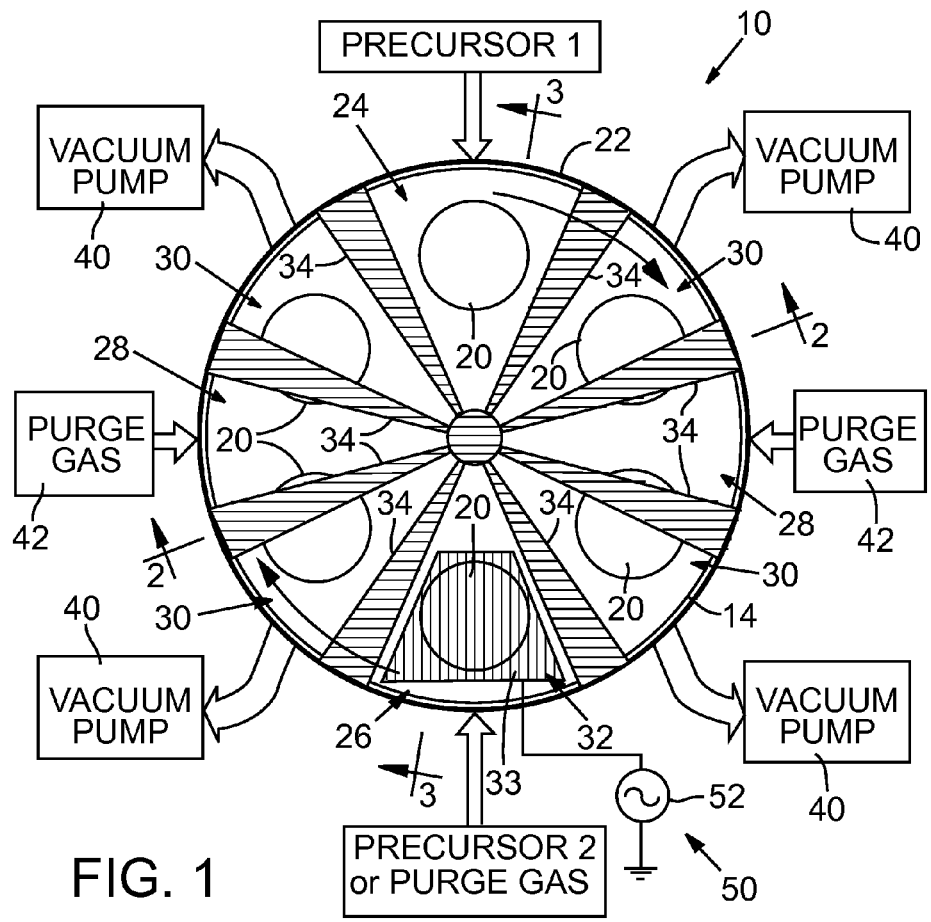
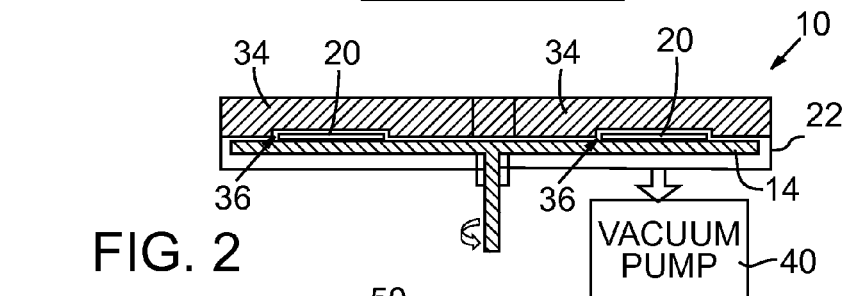
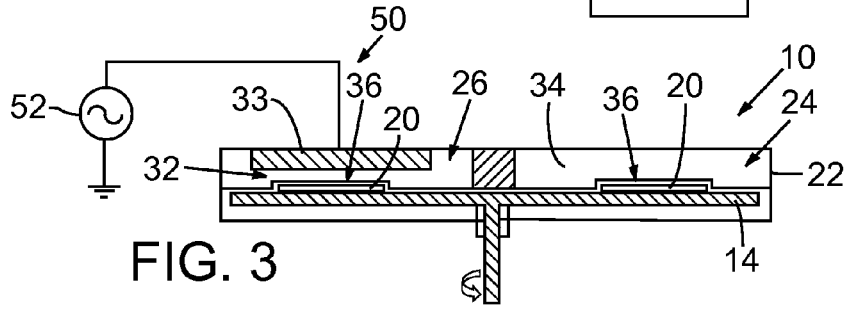

RADICAL-ENHANCED ATOMIC LAYER DEPOSITION SYSTEM AND METHOD

RELATED APPLICATIONS

This application claims the benefit under 35 U.S.C. §119 (e) from U.S. Provisional Application No. 60/820,785, filed Jul. 29, 2006, which is incorporated herein by reference.

BACKGROUND

This disclosure relates to systems and methods for atomic layer deposition (ALD) of thin films on a surface of a substrate using radical species.

An overview of conventional ALD processes is provided in *Atomic Layer Epitaxy* (T. Suntola and M. Simpson, eds., Blackie and Son Ltd., Glasgow, 1990), which is incorporated herein by reference. Numerous patents and publications describe the use of radicals in connection with thin film deposition techniques, including atomic layer deposition (ALD) and sequential chemical vapor deposition. Many chemistries for radical-enhanced ALD (REALD) have been proposed, and many more are expected to be developed in view of the need for efficient production of high quality thin films in semiconductor manufacturing and other industries. Of particular interest are methods of forming non-semiconductor films, such as pure metal films, for use in integrated circuits and for other purposes. See, e.g., U.S. Pat. No. 6,616,986 B2 of Sherman and U.S. Pat. No. 6,200,893 B1 of Sneh.

Radicals (also sometimes called "free radicals") are unstable atomic or molecular species having an unpaired electron. For example, hydrogen gas exists principally in diatomic molecular form, but molecular hydrogen may be split into atomic hydrogen radicals each having an unpaired electron. Many other radical species are known. In embodiments described herein, the radicals produced and used in the thin film deposition process may include highly-reactive radical gas species formed of a single element such as hydrogen, nitrogen, oxygen (e.g. ozone), or chlorine, as well as compound radicals such as hydroxide (OH).

U.S. Provisional Patent Application No. 60/743,786, filed Mar. 26, 2006 ("the '786 application"), and related U.S. patent application Ser. No. 11/691,421, filed Mar. 26, 2007 ("the '421 application"), both titled "Atomic Layer Deposition System and Method for Coating Flexible Substrates, are incorporated herein by reference. The '786 and '421 applications describe systems and methods for ALD in which a substrate such as a flexible web is moved through two or more precursor chambers or zones separated by an isolation chamber or zone to accomplish atomic layer deposition of thin films on the surface of the substrate. As the substrate traverses between the precursor zones, it passes through a series of flow-restricting passageways of an isolation zone into which an inert gas is injected to inhibit migration of precursor gases out of the precursor zones. In the technique described in the '786 and '421 applications, only the substrate gets coated and not the reaction chamber walls or other parts of the system. The present inventors have recognized that the processing system and method of the '786 and '421 applications enables the use of UV light or steady-state plasmas in one or more chambers to generate precursor radicals, instead of requiring radicals to be cyclically introduced into and removed from a common reaction chamber, as has previously been proposed by Sherman, Sneh, and others.

The present inventors have also recognized that oscillating, reciprocating, or circular movement of a substrate can be employed to accomplish ALD processes using precursor radicals that are continuously introduced into a reaction space by a steady-state radical source. When the systems and methods described herein are applied to accomplish thin film deposition processes with radicals, there may be unique benefits and capabilities that are enabled.

Further aspects of various embodiments will be apparent from the following detailed description, which proceeds with reference to the accompanying drawings.

BRIEF DESCRIPTION OF THE DRAWINGS

FIG. 1 is a schematic top view of a thin film deposition system according to a first embodiment in which a circular substrate platen is rotated to move one or more substrates through multiple wedge-shaped precursor and purge zones or chambers;

FIG. 2 is a cross section elevation view of the system of FIG. 1 taken along line 2-2 of FIG. 1;

FIG. 3 is a cross section elevation view of the system of FIG. 1 taken along line 3-3 of FIG. 1;

DETAILED DESCRIPTION OF PREFERRED EMBODIMENTS

Figure 4:
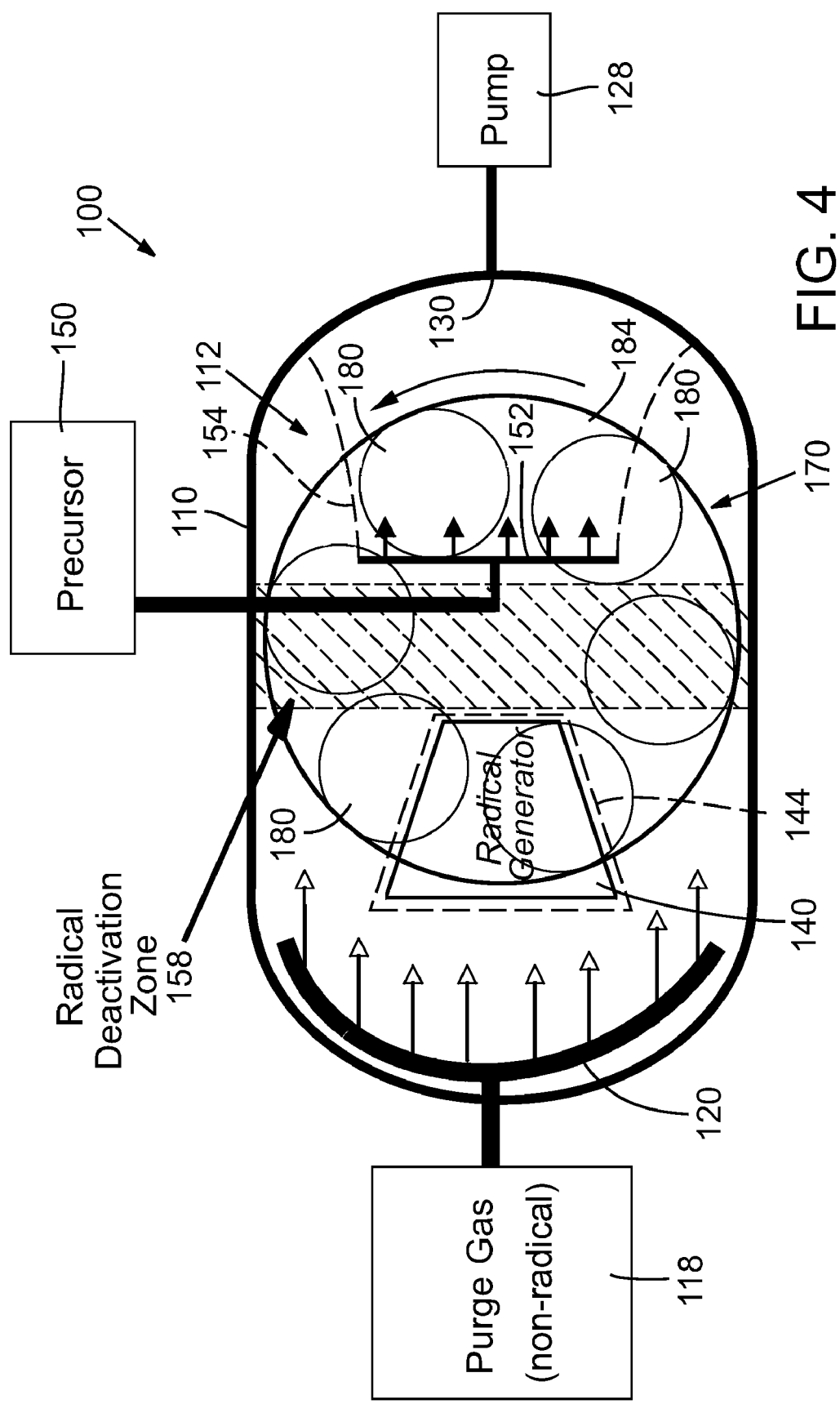
FIG. 4 is a schematic top view of a cross-flow reactor for thin film deposition according to a second embodiment.

Described below are ALD methods and systems that involve moving a substrate between zones that provide alternating exposure to a chemical precursor and a radical species generated by an excitation source (e.g., plasma, ultraviolet radiation (UV), high temperature pre-heat with catalyst, etc.). In some embodiments, the radicals are generated in-situ, i.e., within one of the zones in the immediate vicinity of the substrate. While various system configurations, geometries, and methodologies are envisioned for providing the required substrate movement and precursor exposure, example configurations shown in FIGS. 1-6 and serve to illustrate some potential benefits of methods and systems according to the present disclosure.

FIGS. 1-3 illustrate a radical-enhanced ALD (REALD) system 10 in accordance with a first embodiment. System 10 includes a disc-shaped platter or carrier 14 that carries multiple substrates 20, illustrated as disc-shaped silicon wafers. Substrates of other types and shapes may also be utilized. The substrate carrier 14 spins about its axis within a reaction chamber or process chamber 22 that is divided into several sub-chambers or zones 24, 26, 28, and 30, such that the substrates 20 are transported along a circular transport path sequentially through a first precursor zone 24, an intermediate "purge" zone 28, a second precursor zone 26, and a further intermediate purge zone 28. In the embodiment illustrated in FIGS. 1-3, exhaust zones 30 or buffer zones are interposed between each of the precursor and purge zones 24, 26, 28.

First and second precursor chemicals (precursor 1 and precursor 2) are introduced into the respective first and second precursor zones 24 and 26 simultaneously, the two different precursors being different chemicals. One of the precursor zones (second zone 26 in FIG. 1) may include a radical generator 33 therein for generating a radical species from the second precursor (precursor 2) in a radicals zone 32 within the precursor zone 26. Alternatively, a purge gas may be introduced into second precursor zone 26 and radicals may be generated from the purge gas. The purge gas introduced in second precursor zone 26 may be the same as or different from purge gas injected into one or more of the purge zones 28. The purge gases used are preferably nonreactive with the first precursor (precursor 1). In the embodiment illustrated, each revolution of the substrate carrier 14 results in one full ALD cycle. In alternative embodiments, a greater number of precursor zones and intermediate purge zones may be included in the system 10 to achieve multiple ALD cycles from each revolution of the substrate carrier 14.

In one embodiment, differential pumping and/or exhaust flow control is utilized to generate pressure differentials between certain adjacent zones to thereby prevent the first precursor (precursor 1) from flowing from the first precursor zone 24 into the second precursor zone 26. For example, first and second precursor zones 24 and 26 are preferably operated at pressures that are the same as or slightly lower than adjacent zones to help inhibit precursors 1, 2 from leaking from precursor zones 24, 26. Adjacent precursor and purge zones are separated by partitions 34, with flow-restricting passageways 36 or slits provided in the partitions 34 having slight clearance for substrates 20, so as to inhibit migration of precursors from one precursor zone to the next but to allow the carrier 14 to rotate and move the substrates 20 between the zones 24, 26, 28, 30. For simplicity, substrates 20 are shown in FIGS. 1-3 sitting on top of a platen of carrier 14, but may preferably be inset in pockets (not shown) in the platen, so as to sit substantially flush with a top surface of the platen, allowing improved flow-restriction to be achieved by sizing of passageways 36 to provide only minimal clearance for rotation of the platen. Exhaust zones 30 are preferably coupled to a vacuum pump 40 (or multiple different vacuum pumps) to remove precursor chemicals that may leak from precursor zones 24 and 26. Although partitions 34 are illustrated as fins hanging down above the carrier 14, they may also extend below the carrier 14 to prevent mixing of precursors in the exhaust path, in which case multiple exhaust lines may be employed with inline precursor reclamation systems, as described in the '421 application. The purge zones 28 may be flooded with a non-reactive purge gas 42 at a higher pressure than adjacent exhaust zones 30, providing a back-flow condition to oppose gaseous precursors that have leaked into the adjacent exhaust zones 30, thereby preventing precursors 1 and 2 from mixing in a common zone and reacting, except at the surface of the substrate in an ALD reaction.

In one embodiment, the precursor and exhaust zones 24, 26, 30 are operated at a pressure in the range of 0.01 Torr to approximately 10 Torr, with only slightly higher pressures being maintained in the purge zones 28 by influx of purge gas 42 and/or throttling of outlet passages from the purge zones 28. Operating pressures lower than 0.01 Torr may require more complex vacuum equipment and may not be effective to provide zone isolation by differential pressure, particularly at pressures below which the fluid continuum assumption ceases to apply. Operating pressures higher than 10 Torr may be utilized in some embodiments, depending on the precursor chemical(s) and radical species used in the thin film deposition process. However, at operating pressures greater than 100 Torr it may become more difficult to ignite a radical-generating plasma utilizing a simple radio-frequency (RF) plasma generator or direct-current (DC) plasma generator, and may require a more expensive or less effective radicals generator design. Also, at higher pressures, the mean free path of radicals decreases, which increases the incidence of deactivating collisions between radicals and may reduce substrate exposure rates for a given distance between the radicals generator 33 and the substrate. Thus, operating pressures in the low to medium vacuum range are generally preferred over a higher pressure environment.

The passageways 36 may merely be slots cut in sheet metal partitions; however, the partitions 34 are preferably made wider than sheet metal in the direction of substrate travel. Partitions 34 define elongated flow-restricting passageways between process zones which tend to inhibit inter-zone leakage and mixing of precursors 1, 2. For example, the passageways 36 may be on the order of the same width in the direction of travel as the chambers of the various precursor and purge zones. FIG. 1 depicts wedge-shaped partitions 34 and passageways 36 therethrough (FIGS. 2-3), but other shapes may also be suitable, depending on the substrate path. For convenience and clarity of illustration, the partitions 34 are shown in FIGS. 1-2 as being solid, but could also be made hollow.

In the system illustrated, there are two differentially pumped purge zones 28, with a substrate passing through one of the purge zones 28 and a flanking pair of exhaust zones 30 after each exposure to one of the first and second precursor chambers 24, 26. In another embodiment (not shown), one or more of the purge and exhaust zones 28, 30 may be omitted. For example, cross-contamination of precursors may be prevented by maintaining a higher pressure in purge zones 28, than in the precursor zones 24 and 26, inhibiting both precursor 1 and precursor 2 from escaping their respective precursor zones.

Another approach to eliminating or reducing the number of purge and evacuation zones used is to utilize a normally inert purge gas for precursor 2 which is so unstable in its radicalized form that the radicals recombine or otherwise deactivate before they can escape the precursor chamber 26 or adjoining passageways 36, even without differential pressure or a back-flow condition. Upon deactivation, the radicals typically recombine to form a molecule that is nonreactive with the first precursor. The inventors have recognized that when a highly unstable radical species is used to perform REALD, the purge and exhaust zones 28, 30 may be eliminated entirely if a greater pressure is maintained in the second precursor zone 26 than the first precursor zone 24 so that the non-radical precursor (precursor 1 in this example) is effectively isolated or purged away from the radicals zone 32. Thus, in a two-chamber system, a pressure differential between the precursor zones 24, 26 generated through differential pumping or injection may operate to prevent the non-radical precursor (precursor 1) from flowing into the radicals zone 32 and causing non-ALD reactions.

One example of such a highly unstable radical species is atomic hydrogen, generated from hydrogen gas ($H_2$). Hydrogen gas may be safely handled and delivered to the second precursor chamber 26 in the form of a nonflammable forming gas—a mixture of approximately 4% hydrogen gas and the balance an inert gas such as helium (He). In its non-radical gaseous form, hydrogen gas (or forming gas) may serve as a purge gas. Hydrogen gas may also be readily disassociated into atomic hydrogen radicals ($H^-$) through ignition of a plasma via radicals generator 33. Atomic hydrogen radicals may be used to perform a step in ALD of metal thin films according to process chemistries described by U.S. Pat. Nos. 6,616,986 B2 of Sherman and 6,200,893 B1 of Sneh.

Although the embodiment of FIGS. 1-3 depicts a substrate carrier supporting six substrates, alternative embodiments may include substrate carriers that support a smaller or larger number of substrates. For example, in one embodiment, a substrate carrier holds a single substrate that is rotated about its central axis. In still other embodiments, the substrate carrier may move the substrate back and forth in a reciprocating translating manner or in another movement pattern, so that substrates are moved between a first precursor zone, a first purge zone, a second precursor zone, and a second purge zone (which may or may not be the same as the first purge zone), and perhaps also to one or more evacuation zones.

The entire system 10 may be heated or merely the volume of precursor zones 24 and 26 of the system may be heated. Alternatively, the substrate itself may be heated instead or in addition to the system 10 or precursor zones 24, 26. At least one of the precursor zones 24 and 26 is a radicals zone 32 wherein radicals are generated or introduced. The radicals may be generated by any of many well known excitation sources, such as a plasma, corona discharge, filament array, ultraviolet light, microwave energy, radio-frequency (RF) energy, and direct current (DC) for example. An excitation source 50 may include a power source 52 coupled to a radicals generator 33 positioned at least partially in the radicals zone 32 for generating radicals in-situ. When an optical source (not shown) is used for radicals generator 33, it may be located just outside of radicals zone, beyond a window into radicals zone 32 through which illumination is directed. In still other embodiments (not shown) the radicals generator may be remote from the radicals zone 32.

If the excitation source is remote from the radicals zone 32, remotely-generated radicals must be transported into the radicals zone 32 so that a sufficient amount of the radicals reach the surface of the substrate before recombining or otherwise deactivating. U.S. Pat. No. 5,256,205 describes one method and device utilizing a microwave cavity for generating a plasma to disassociate a reagent gas into highly-reactive radicals, which are then transported into a reaction chamber by a surrounding jet of supersonic carrier gas. The radical generation and injection method of the '205 patent may be useful for remote generation and delivery of radicals in conjunction with the systems and method described herein.

The excitation source 50 is preferably operated in a continuous or steady-state manner, rather than being pulsed on and off during each deposition cycle. In one embodiment, the radicals are generated from the precursor present in the radicals zone 32. In some embodiments, the radicals are generated from a purge gas flowing through the radicals zone 32. Ions may also be generated together with or instead of the radicals. An ion containment or neutralizing device, such as a Faraday cage, may be used with the radicals generator to inhibit ions from reaching the substrate. In other embodiments, the radicals comprise radical ions. And in still other embodiments, ions are generated for use in thin film forming reactions instead of or in addition to radicals. For convenience, chemicals from which radical species or ions are generated are sometimes referred to herein as precursors, regardless of whether any component thereof ultimately forms part of the thin film deposited on the substrate.

Systems according to the present disclosure may expose to precursors either one or both sides of flat substrates like semiconductor wafers, depending on the shape and structure of the substrate carrier, and whether the bottom side of the substrate is masked by the carrier. Systems according to the present disclosure may also be incorporated in or combined with other tools or devices. For example, systems and methods disclosed herein by be incorporated in so-called cluster tools for semiconductor processing, wherein multiple process steps (such as deposition, etch, planarization, etc.) are performed serially at a single station or in adjacent stations managed by a centralized control system. In a cluster tool implementation, systems for ALD according to the present disclosure may have a substrate carrier sized to hold and rotate or translate a single wafer, rather than the multi-wafer platter shown in FIG. 1.

As mentioned above, systems according to the present disclosure are not limited to rotating substrate carrier systems of the kind shown in FIG. 1, but may also include carriage configurations that provide for rotation, translation, or other reciprocating or circulating motion of a substrate through or into contact with multiple precursor zones. Movement of the substrate may be accomplished without movement of a platter or other platter-like carriage. For example, the substrate may be handled by its edges as it is moved through processing zones of the system. Examples include rotation of the substrates on a cylindrical substrate carriage, a linear reciprocating system, and a flexible substrate web coating system of the kind described in the '786 and '421 applications (App. Nos. 60/743,786 and 11/691,421), which are incorporated herein by reference. Advantageously, systems should be designed to prevent free precursor (i.e. precursor that is not adsorbed to the substrate surface) from one precursor zone from reaching one or more of the other precursor zones, including the radicals zone 32.

In some embodiments, the radicals of the radicals zone may be deactivated prior to reaching the precursor zone by making the path length between the radical and precursor zones sufficiently long to allow deactivation to occur. On the other hand, the throughput of the system is improved by moving the substrate as quickly as possible and by spacing the precursor zones as closely as possible, so the precursor zones should preferably be spaced no farther apart than necessary to prevent non-ALD deposition. Radicals may also be deactivated by "active deactivation device" or means, such as the use of other vapor species which facilitate the deactivation, or by the use of materials that would react with the radicals to either trap or deactivate them, for example, a getter or a catalyst for deactivation on some of the surfaces between the radicals zone and the next precursor zone. Passive deactivation may be accomplished by allowing sufficient distance between the radicals zone and, optionally, by providing baffles along the zone between the radicals zone and the precursor zone to increase surface area for collisions.

By configuring the precursor zones 24 and 26 and intermediate purge zones 28 so that non-surface bound radicals cannot reach the precursor(s) and vice-versa, the excitation source may remain activated in a stable, steady state during the entire deposition sequence without undesirable consequences of the radical mixing with the non-radical precursor in the reaction chamber. Preventing such mixing may prevent partial or complete decomposition of the non-radical precursor or precipitation of reaction products. Thus, the systems described herein may also prevent the accumulation of film along walls of the precursor zones. Since there is no coating accumulation on the walls, nor particularly on the excitation source or nearby surfaces, excitation sources such as plasma sources may be made more stable over the duration of many runs (each run comprising perhaps thousands or tens of thousands of ALD cycles). Furthermore, optical sources such as UV light sources may be used as steady-state excitation sources because ALD coatings, which might otherwise accumulate in a pulsed traveling wave ALD reactor, can be prevented from depositing on optical windows to the radicals zone through which such light sources are projected. The ease by which UV sources and other optical excitation sources may be employed in systems and methods of the present disclosure is expected to facilitate metal deposition processes using ALD, as well as the formation of oxides, nitrides, and other materials by ALD.

For cases where only the radical species is reactive with the other precursor(s), isolation of the precursor zones to prevent areas where they are simultaneously present, can be greatly simplified. Inert gas flows and/or local pumping speeds may be modulated in different areas of the overall chamber, to generate a pressure gradient and a net flow of precursors and reaction byproduct gasses away from the radical generation zone 32. The radicals re-combine or are otherwise deactivated prior to reaching the other precursor zone(s). For many desirable chemistry sets, such as those that use hydrogen radicals, deactivation may be accomplished passively by simply separating the zones by a distance sufficient to allow the recombination of the radicals.

Figure 5:
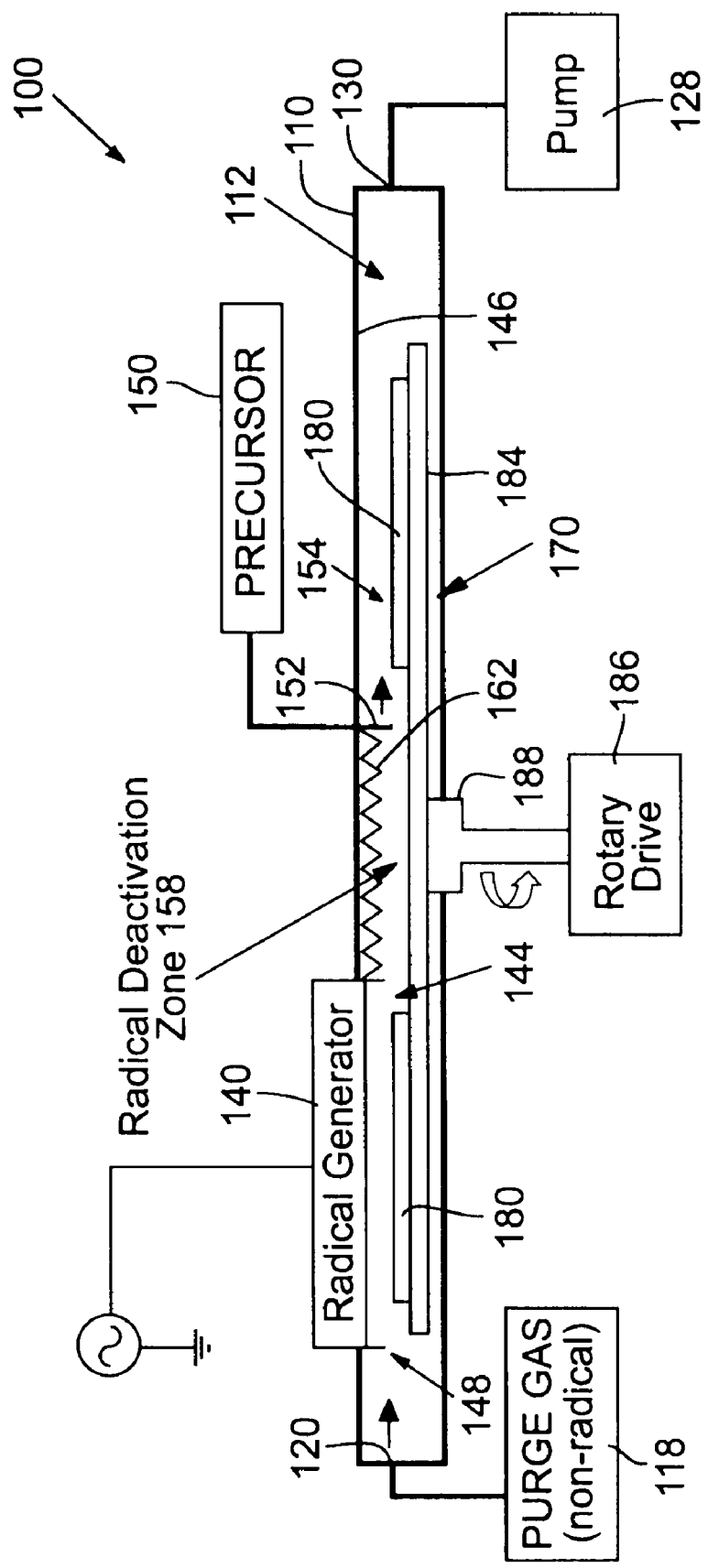
FIG. 5 is a schematic elevation view of the cross-flow reactor of FIG. 4.

FIGS. 4 and 5 illustrate top and side schematic views of a cross-flow REALD reactor system 100 in accordance with another embodiment. With reference to FIGS. 4 and 5, system 100 includes a reaction chamber 110 that bounds a reaction space 112. A purge gas source 118 is coupled to the reaction chamber at an inlet 120 and a vacuum pump 128 is coupled to an outlet 130 at the opposite end of reaction chamber 110 from inlet 120 so as to provide a continuous flow of purge gas along a flow path extending between inlet 120 and outlet 130. Reaction space 112 may be elongated in the direction from inlet 120 to outlet 130 so as to facilitate laminar flow or an even flow distribution of purge gas across the reaction space 112 as the purge gas flows across processing zones. A radicals generator 140 is positioned along a flow path of the purge gas for exciting purge gas and generating radicals in a radicals zone 144 within reaction space 112. The reaction chamber 110 may be situated inside of a surrounding pressure vessel (not shown) of an ALD reactor, such as a Planar Systems P400A reactor, with process and purge gases being supplied through the pressure vessel to reaction chamber 110 via feedthroughs.

Radicals generator 140 may include of any of the types of radicals generators described above with reference to FIGS. 1-3, but may preferably be a DC or RF generator located along a top panel or lid 146 of reaction chamber 110 for generating a plasma and accompanying radicals in-situ. In another embodiment, the radicals generator includes a UV light source. In addition to an excitation device proximal of the reaction chamber lid 146, radicals generator 140 may include a containment shield 148 or curtain that projects away from lid 146 toward the substrate path to help contain and maintain radicals in radicals zone 144. Containment shield 148 may be formed of a non-conductive material, such as polytetrafluoroethylene (PTFE) sold by DuPont Corporation under the Teflon® brand, to prevent loss of ions. Alternatively, containment shield 148 may be formed of an electrically conductive material for reducing ions. A PTFE containment shield 148 may comprise a cylinder that extends from a plasma generator electrode to within 0.25 inch or less from the substrate path. In an alternative embodiment (not shown), the radicals generator 140 is located outside of the reaction chamber for remote radical generation.

A source of precursor gas 150, such as a metal-containing precursor gas is piped into reaction chamber 110 to a precursor injector 152, where it is injected into the reaction space 112 at a precursor zone 154 spaced apart from radicals generator 140 and radicals zone 144. Precursor injector 152 is preferably positioned generally downstream in the flow path of the purge gas relative to radicals generator 140 and radicals zone 144, leaving a radical deactivation zone 158 between the radicals zone 144 and the precursor zone 154. In the embodiment illustrated, precursor injector 152 is located directly downstream from radicals generator 140 along its leeward side. However, in other embodiments, radicals generator 140 and precursor injector 152 may be staggered in the flow path so that the precursor injector 152 is not directly in the lee or wake of the radicals generator 140, but is still closer to outlet 130 than radicals generator 140 (i.e., generally downstream of radicals generator 140). In still another embodiment, precursor injector 152 and radicals generator 140 may be located side-by-side at the same distance from inlet and outlet, but spaced apart to prevent the flow or migration of precursor gas into radicals zone 144. Precursor injector 152 may comprise a wand with holes along its length, as illustrated in FIG. 5, which may extend across and over the path followed by substrates 180. In alternative embodiments, precursor injector 152 may include a showerhead type injector or any other type of gas injector, but preferably one that distributes gas across a desired processing zone.

As with the embodiments described above with reference to FIGS. 1-3, the purge and precursor gases are preferably not reactive with each other, except when the purge gas is radicalized. The flow of purge gas through radicals zone 144, deactivation zone 158 and precursor zone 154 establishes pressure and flow conditions within the reaction space 112 that substantially prevent precursor gas from flowing into the radicals zone 144 and reacting with radicals generated by radicals generator 140. And the distance between the radicals zone 144 and the precursor zone 154 may also allow radicals to be deactivated or otherwise cease to be present in any substantial amount before reaching precursor zone 154, so they will not react with the precursor gas. For example, hydrogen radicals may deactivate over a distance as short as 1 mm under some process pressure and temperature conditions, but under other conditions may require 5 cm to 20 cm, or more, to deactivate. Deactivation of oxygen or nitrogen radicals typically requires a greater distance than for hydrogen, or the use of an active deactivation device.

An active radicals deactivation device, such as a getter, catalyst, reactive gas species, and/or a charged or grounded electrode may be located in radical deactivation zone 158 to help inhibit radicals from reaching precursor zone 154. In another embodiment, a grid of conductive mesh may extend across radical deactivation zone and be coupled to the conductive material of reaction chamber 100 to form a Faraday cage around precursor zone 154. One radicals deactivation device, illustrated in FIG. 5, includes a series of baffles 162 for enhancing deactivation in radicals deactivation zone 158. Baffles 162 may comprise a series of ridges along top lid 146 of reaction chamber 110 for increasing the available surface area for collisions and by disturbing the flow patterns, thereby increasing the likelihood of collisions between radicals. Deactivation devices such as baffles 162 which consume no outside energy or material are referred to herein as a passive deactivation devices.

Again referring to FIGS. 4-5, system 100 includes a carriage 170 for transporting one or more substrates 180 along a transport path between the radicals zone 144 and the precursor zone 154. Six substrates are illustrated in FIGS. 4-5, but more or less could be processed in different embodiments of the system. Carriage 170 preferably includes a rotating platen 184 that moves the substrate alternately between the radicals zone 144 and the precursor zone 154 for alternately exposing each substrate 180 to the radicals and precursor gases. Platen 184 is driven by a drive motor 186 preferably located outside reaction chamber 110 and the pressure vessel (not shown) and coupled to platen 184 by a rotary feedthrough 188.

In operation, one or more substrates 180 are loaded onto platen 184 of carrier 170, then the reaction chamber 110 is sealed. For example, in a semiconductor processing operation, wafer substrates 180 may be loaded by a robotic wafer handling system through a load lock (not shown) at a side of the reaction chamber 110. For example wafers may be loaded from a front-opening unified pod (FOUP) by a robotic wafer loader. After the substrates 180 have been loaded and the reaction chamber 110 closed, the reaction space 112 is then purged to remove unwanted gases. Reaction chamber 112 is then pumped via vacuum pump 128 to a desired operating pressure and substrates 180 are heated by heaters (not shown) to a desired operating temperature. Generally, low to medium vacuum pressures in the range of 0.01 Torr to 100 Torr, and temperatures in the range of 15° C. to 400° C. are suitable for REALD utilizing the system and methods described herein. Higher temperatures may be used, but are less desirable due to issues relating to mechanical reliability of the deposition reactor and possible decomposition of precursors leading to undesirable non-ALD CVD growth. Colder temperatures may be used, but may be less desirable due to condensation of low vapor pressure precursors on cold surfaces of the reaction chamber or elsewhere in the system. In one embodiment, the reaction chamber is brought to an operating pressure of approximately 2 Torr and an operating temperature of approximately 150° C. Other exemplary process conditions are described below under the heading "Example". In other embodiments, process chemistries may allow operating temperatures and pressures that are much higher or lower. For example, some chemistries may be operable at atmospheric pressure and temperature, and others at elevated temperatures and/or pressures. During or after pump-down of reaction space 112, a cleansing plasma may be generated and applied to substrates 180 to remove contamination. After plasma cleansing, the reaction space 112 may again be purged with an inert gas before commencing REALD deposition cycles, as follows.

While maintaining the operating pressure and temperature, a continuous flow of purge gas is introduced into the reaction chamber 110 through inlet 120. Radical generator 140 is activated to apply energy to and strike a plasma in the purge gas present in radicals zone 144. The plasma is preferably kept ignited throughout the following processing sequence, thereby maintaining a gaseous radical species within the radicals zone 144. A precursor gas is introduced into precursor zone 154 downstream from radicals zone 144 via precursor injector 152. The precursor gas is preferably introduced in a continuous flow. The flow of purge gas from inlet 120 is desirably sufficient at the operating pressure to inhibit the precursor gas from flowing into radicals zone 144 or otherwise being swept or dragged into radicals zone 144 by movement of carriage 170, except for precursor that has adsorbed to the surface of the substrate 180 and carrier 170, as discussed below. The flow of purge gas may establish, in the direction of purge gas flow, a pressure differential between radicals zone 144 and precursor zone 154 that prevents migration of precursor gas from precursor zone 154 into radicals zone 144.

Carriage 170 transports substrates 180 alternately between radicals zone 144 and precursor zone 154 to thereby alternately expose substrate 180 to the radical species and the precursor gas multiple times. In the embodiment illustrated, carriage 170 transports substrates 180 along a circular transport path. In other embodiments, the transport path may be linear, elliptical, or another shape, resulting from circulating or reciprocating motion of substrates 180 between processing zones for alternating exposure to radicals and precursor gases. The alternating exposures provide the necessary processing conditions for ALD film growth. Each exposure of a substrate 180 to the precursor gas results in some of the precursor gas adsorbing to the substrate 180 as an adsorbed precursor. Because the adsorption process may involve a chemical transformation or reaction, the adsorbed precursor may be chemically distinguishable from the precursor gas. In ALD deposition, only a monolayer (a single atomic or molecular layer) of adsorbed precursor will be present on the substrate, because the precursor gas will not attach to or react with adsorbed precursor. As used herein, the term "monolayer" includes imperfect monolayers, wherein less than total coverage is achieved or some stacked or dislocated regions result in slightly more than one continuous atomic or molecular layer.

After an exposure of the substrate to the precursor gas in precursor zone 154, translation of the substrate 180 results in a subsequent exposure of substrate 180 to the radical species in radicals zone 144. Exposure of substrate 180 to radicals zone 144 results in at least some of the radicals converting at least a portion of the adsorbed precursor to another element (such as pure metal) or another compound material. Of course, to achieve the desired reaction, the radical generator 140 should be operated so as to maintain a sufficient population of radicals at the surface of the substrate 180 to achieve a desired ALD reaction (at least at the location where substrate 180 is closest to the radicals generator 140). In some chemistries, the radicals serve as a second precursor such that the exposure to radicals results in a further monolayer of an additional material forming through a chemical reaction with the adsorbed (first) precursor. In other embodiments, the radicals may facilitate an exchange reaction but are not permanently incorporated in the thin film.

The circulating or reciprocating movement of substrate 180 returns substrate 180 to the precursor zone 154 via deactivation zone 158. As described above, deactivation zone 158 serves as a substantial barrier to the passage of free radicals to precursor zone 154. Of course, the deactivation need not be perfect, and trace radicals may pass to precursor zone 154, provided that they do not frustrate ALD growth overall. Upon the return of substrate 180 to precursor zone 154, some of the precursor gas again adsorbs to substrate 180, i.e., to the monolayer of thin film previously coated, and the process repeats.

For characteristic ALD films to form, each sequential exposure of substrate 180 to a precursor gas or radical species should involve a self-limiting, theoretically saturating surface reaction. And by preventing precursor gases and radical gases from mixing in the reaction space, the reactions occur only at the surface of the substrate, at available reaction sites. Theoretically all or substantially all available reaction sites at the surface of substrate 180 become occupied and the surface is said to be saturated, terminating each reaction step. However, as each reaction step proceeds to completion, the surface is converted from being reactive to non-reactive as to the gaseous precursor or radical involved in that step, and the reaction rate slows exponentially over time according to the Langmuir principles of molecule-surface reaction kinetics. The self-limiting reaction kinetics of ALD and REALD both exhibit thin film deposition rates that does not increase linearly with dosage increases. ALD and REALD are therefore evidenced by a growth rate that is not linear over time during a precursor exposure and that does not increase linearly as a function of exposure dosage.

It is noted that the rate of movement of the substrate 180 by carriage 170 and the size of the process zones 144, 154 controls the exposure times. Desirable exposure times may range from between 50 milliseconds (msec) and 100 msec in one embodiment operating at 2 Torr and 150° C. and utilizing atomic hydrogen radicals. However exposure times from 10 msec to 100 seconds may also be utilized, depending on the operating temperature and pressure within the reaction chamber 110, and the chemistry of the deposition process. Desirable exposure times for a metal deposition process utilizing hydrogen radicals may be achieved for 200 mm wafers, a comparably sized precursor zone 154, and a comparably sized radicals zone 144 using a rotating carriage 170 spinning at approximately 90 rpm, for example. Similar results may be achieved in a reciprocating carriage system (not shown) transporting substrate 180 through processing zones at 2 meters per second (m/s), for example.

The carriage 170 may also be driven to move one or more substrates at variable rates, to achieve different exposure times and movement rates at different locations along the transport path. For example, substrate 180 may be moved quickly through the radicals zone 144, and more slowly through the deactivation and/or precursor zones 158, 154.

In the system of FIGS. 4-5 and for a substrate circulation rate of 90 rpm, the cycle time for one complete REALD cycle is approximately 0.67 second, resulting in deposition rates of between approximately 50 angstroms per minute (Å/min) and 100 Å/min. Thus, using a 6-wafer rotating platen system, a throughput of better than 1 wafer per minute may be achieved for atomic layer deposition of thin films (such as a metal film) that are at least 50 Å thick, based on system platter load/unload time of approximately 2 minutes, heat-up time of approximately 3 minutes, and deposition run time of approximately 1 minute.

In another embodiment (not shown) the radical and precursor zones 144, 154 may be arranged side-by-side, with a longitudinal partition (not shown) therebetween to prevent migration of precursor gas from precursor zone 154 into radicals zone 144. In this embodiment, carriage 170 moves substrates 180 through one or more flow-restricting passageways in the partition.

In between each exposure to precursor gas and radicals, reaction byproducts and excess precursor(s) continue to be pumped out of the reaction chamber 110 by pump 128. Reaction byproducts and precursor(s) are preferably nonreactive in the reaction space 112. For example, reaction byproducts of the self-limiting surface reaction occurring in radicals zone 144 preferably do not react with the precursor gas or with byproducts of the self-limiting surface reaction taking place in precursor zone 154. Repeated cycles of alternating precursor and radical exposure result in deposition of a conformal thin film, preferably having typical ALD qualities such as being pinhole free.

Figure 6:
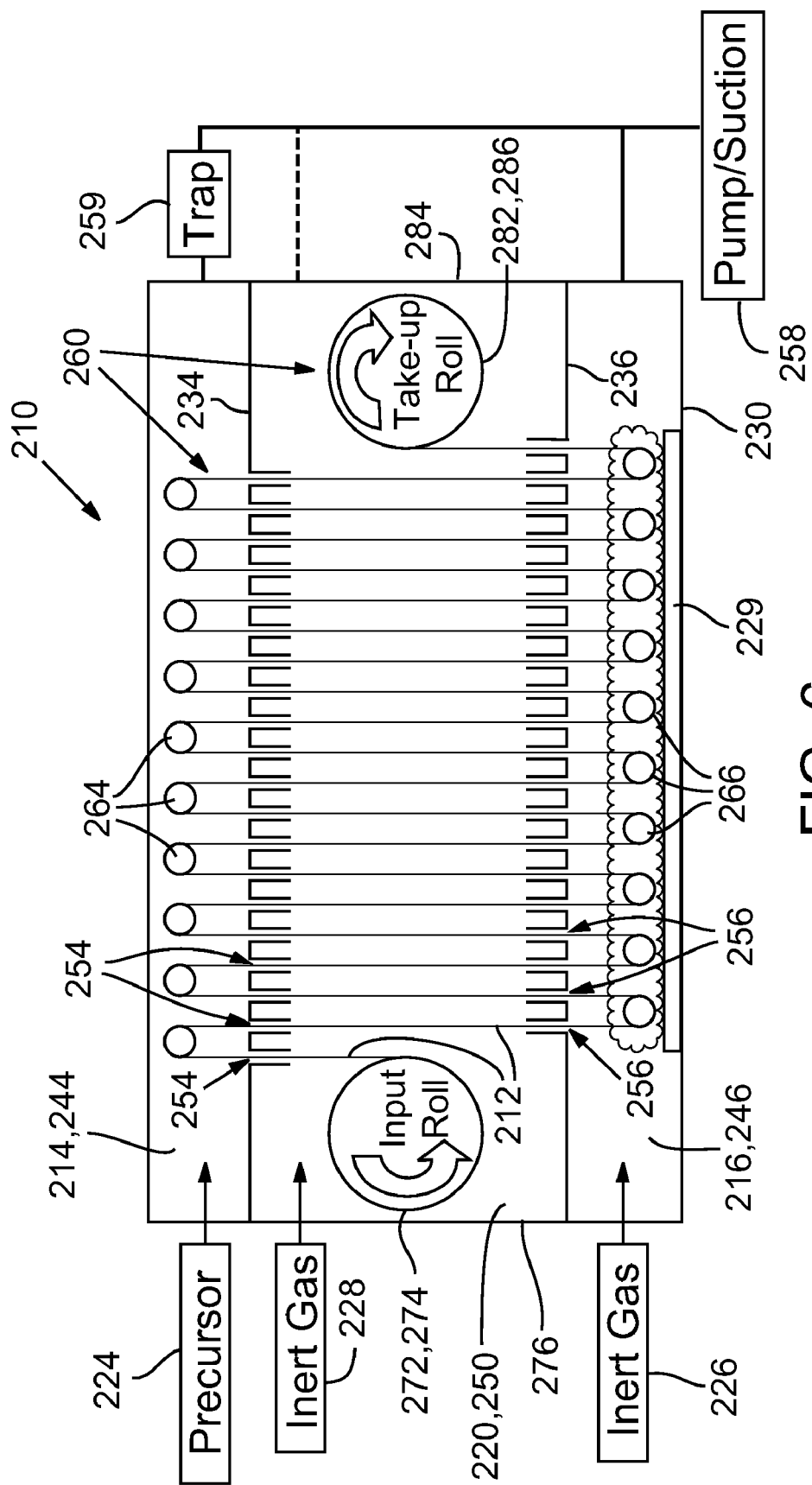
FIG. 6 is a schematic view of a web coating apparatus according to a third embodiment.

FIG. 6 shows a cross section elevation of a system 210 for REALD deposition of a thin-film coating onto a flexible substrate 212 (shown in profile in FIG. 6), such as a web of plastic film or metal foil, for example. With reference to FIG. 6, system 210 includes a precursor zone 214 and a radicals zone 216, separated by an intermediate isolation zone 220 in which an inert fluid is present. The inert fluid may comprise an inert liquid, but more preferably consists essentially of an inert gas, such as nitrogen ($N_2$). When in use, a precursor gas is introduced into the precursor zone 214 from a precursor delivery system 224. A second precursor gas or a purge gas is introduced into radicals zone 216 from second precursor delivery system 226. Precursor delivery systems 224, 226 may include precursor source containers (not shown) located outside or within precursor and radicals zones 214, 216. Additionally or alternatively, precursor delivery systems 224, 226 may include piping, pumps, valves, tanks, and other associated equipment for supplying precursor gases into precursor and radicals zones 214, 216. An inert gas delivery system 228 is similarly included for injecting inert gas into isolation zone 220. In some embodiments, the same inert gas may be injected into isolation zone 220 and radicals zone 216.

Radicals may be formed in the radicals zone 216 by a radicals generator 229 similar to any of those described above with reference to FIGS. 1-5. Radicals generator 229 may preferably continuously generate a population of a radical species (illustrated by a cloud in FIG. 6) within radicals zone 216 by means of a plasma, for example. In an alternative embodiment, radicals generator 229 may be located outside of the chamber 246 to generate radicals remotely for subsequent delivery into radicals zone 216. As with other embodiments described herein, radicals generator 229 may be operated in a continuous or steady-state mode without incurring the penalties of plasma ramp times and build-up of undesirable films on the radical generator 229 and walls of the reaction chamber 230.

Precursor zone 214, radicals zone 216, and isolation zone 220 are bordered by an outer reaction chamber housing or vessel 230, divided by first and second dividers 234, 236 into three sub-chambers, namely, a first precursor chamber 244, a second precursor chamber 246 and an inert gas chamber 250. Vessel 230 may comprise a pressure vessel or vacuum vessel substantially isolating the process space from the external environment. In other embodiments, the vessel 230 may have entrance and exit passageways for interfacing with other process modules or equipment. A series of first passageways 254 through first divider 234 are spaced apart along a general direction of travel of substrate 212, and a corresponding series of second passageways 256 are provided through second divider 236. The passageways 254, 256 are arranged and configured for substrate 212 to be threaded therethrough back and forth between precursor and radicals zones 214, 216 multiple times, and each time through isolation zone 220. For a web substrate, passageways 254, 256 preferably comprise slits having a width (exaggerated in FIG. 6) that is slightly greater than the thickness of substrate 212 and a length (not shown) extending into the plane of FIG. 6 (i.e., normal to the page) and that is slightly greater than a width of the substrate 212. Isolation zone 220 is, thus, preferably separated (albeit imperfectly) from precursor zone 214 by first divider 234 and from radicals zone 216 by second divider 236.

To substantially prevent non-ALD reactions caused by mixing of non-adsorbed quantities of the precursor gas and radicals in one of the chambers 244, 246, 250, the system 210 may inhibit the migration of the precursor from precursor zone 214 into isolation zone 220 and the migration of radicals from radicals zone 216 into isolation zone 220. Passageways 254, 256 are preferably configured to restrict the flow of gases between the zones 214, 216, 220, to avoid or limit diffusion of precursor gases and radicals into a common zone. Passageways 254, 256 may include slits sized only slightly thicker and wider than the thickness and width of the substrate 212 passing through them, leaving only a very small amount of headroom and margins to allow substrate 212 to pass therethrough without scraping against the sides of the passageways. For example, headroom and margins may range between microns and millimeters in certain embodiments. The passageways 254, 256 may also include elongate tunnels through which the substrate 212 passes. Such slits and tunnels are sometimes referred to as slit valves, although no actual moving valve gate is utilized. Passageways 256 may be equipped with passive or active radicals deactivation device, such as baffles or a catalyst, for example, for further inhibiting radical species from escaping radicals zone 216. A radicals deactivation zone may extend from just beyond the cloud of radicals shown in FIG. 6, to the uppermost end of passageways 256.

In an alternate embodiment (not shown), the inert gas chamber 250 of isolation zone 220 and dividers 234, 236 are eliminated, so that isolation zone 220 essentially consists of a series of long narrow passageways extending completely between precursor zone 214 and radicals zone 216. In such an embodiment, no common inert gas chamber 250 connects the passageways, so inert gas is injected directly into the passageways medially of the precursor zone 214 and radicals zone 216 to help prevent precursor migration and mixing. Isolation zone 220 of this embodiment would include a manifold, or a number of manifolds, for routing inert gas lines to nozzles along the sides of the passageways. The manifold or manifolds would be formed in the material of the reaction chamber bordering the passageways, and may be connected to an inert gas delivery system along the sides of the system, rather than at an end of the system as shown in FIG. 6.

To help isolate the precursor gas from the radical species, pressure differentials are preferably established between the isolation zone 220 and the precursor zone 214 and between the isolation zone 220 and the radicals zone 216. In one embodiment, the pressure differentials may be generated by injecting inert gas into isolation zone 220 at a pressure greater than the operating pressure of the precursor and radicals zones 214, 216, and then passively exhausting gases from the zones 214, 216. In another embodiment, the exhaust from precursor and radicals zones 214, 216 could be controlled relative to a passive exhaust from isolation zone 220 or by throttling an exhaust flow from isolation zone 220. Pressure differentials may also be generated by pumping from precursor zones via pump 258 or another source of suction. Optionally, pump 258 may be coupled to all zones, with flow from the various zones being controlled to maintain the pressure differential. The migration of precursors from the precursor and radicals zones 214, 216 into the isolation zone 220 may also be prevented or limited by controlling both the relative flow rates of gases into the zones and pumping speeds from the zones, through the use of flow control valves, and other flow control devices. Flow and pressure controls may be simplified through the use of highly unstable radicals that tend not to persist long enough to escape the second precursor chamber 246, in which case the pressure and flows need be controlled only to prevent the precursor from migrating from precursor zone 214 into radicals zone 216. A control system (not shown) responsive to pressure sensors in the various zones may also be utilized to control gas injection and exhaust flow rates to help maintain a desired pressure differential.

In one example, isolation zone 220 operates at a pressure of approximately 5 millitorr (i.e., the inert gas injection pressure may be 5 millitorr), and pressure differentials of approximately 0.1 millitorr are maintained between isolation zone 220 and each of the precursor and radicals zones 214, 216, so that an operating pressure of approximately 4.9 millitorr is maintained in precursor and radicals zones 214, 216 by way of suction applied to zones 214, 216 by pump 258. Lower and significantly higher pressure differentials may also be used in some embodiments. The necessary pressure differential will be affected by the geometry of passageways 254, 256 (including height, width, and tunnel length, if applicable), the headroom and margins around substrate 212 within passageways 254, 256, the transport speed of substrate 212, the surface roughness of substrate 212 and passageways 254, 256, and the location at which inert gas is injected, such as direct injection into passageways 254, 256 or generally into inert gas chamber 250. Other factors, such as operating temperature, pressure, precursor species, and substrate type, may also affect the amount of pressure differential necessary to inhibit or prevent migration of precursor gases through passageways.

In some ALD processes, precursor gases having a very low vapor pressure are utilized. To facilitate pumping and diffusion control, an inert carrier gas may be mixed with such precursor gases, either before or after introduction of the precursor gases into the system 210, to control the pressure within zones 214, 216.

In some embodiments, it may be desirable to equalize the pressures, or to deliberately mismatch the pressures in two or more precursor zones to optimize growth conditions, or improve utilization of precursor materials. It may also be desirable to pump two or more of the zones separately, and introduce inert gas into the precursor zones separately to further reduce zone migration; for instance, a cross-flow condition may be used to flow precursor in a direction orthogonal to the passageways 254, 256 (between first and second ends 272, 284). Inert gas may be introduced locally within or near passageways 254, 256, to inhibit gases from either adjacent zone from crossing through passageways 254, 256. If further isolation is necessary, multiple differentially-pumped and purged zones may be used in series, with flow-restricting passageways or wiper valve isolation between zones and exhaust paths from each of the zones.

As described above, the precursor and radicals zones 214, 216 may be pumped to achieve an isolating pressure differential between the isolation zone and the precursor zones. In one configuration (not shown), separate pumps could be used for each of the zones 214, 216, 220, preventing mixing of precursor gases in the pump stack and the attendant growth of material or reaction byproducts in any of the pumping lines, thereby preventing powder and residue from accumulating and clogging the pump stack. Another way to inhibit undesirable material deposits in the pump stack is to trap exhaust precursors using a precursor trap 259, such as a simple inline liquid nitrogen cooled trap. Similar precursor traps may be placed in each of the precursor exhaust lines upstream of their junction before the pump 258. By using inert gases and precursor materials having different vapor pressures at a given temperature, it may be possible to trap and reclaim up to approximately 100% of exhaust precursor gases, while passing inert gases to the pump stack. And because different precursors are not mixed in the zones, the precursor purity is maintained, enabling up to 100% utilization of precursor materials. Once filled, trap 259 may be replaced and the full trap 259 sent to another place for precursor recovery. Alternatively, a filled trap 259 may be converted into a precursor source by replacing the coolant in trap 259 with a heated liquid or by activating heating elements outside trap 259. The particular operating temperature of trap/source would depend on the precursor being trapped and its vapor pressure. A liquid nitrogen trap, for example, may operate at lower than 100° Kelvin. Other precursor traps and recovery/recycling systems are described in detail in the '421 application, which is incorporated herein by reference. Similar traps may be used with the embodiments of FIGS. 1-6 described herein.

A substrate transport mechanism 260 of system 210 includes multiple turning guides for guiding flexible substrate 212, including a set of first turning guides 264 spaced apart along precursor zone 214 and a second set of turning guides 266 spaced apart along radicals zone 216. Turning guides 264, 266 cooperate to define an undulating transport path of substrate 212 as it advances through system 210. The substrate transport mechanism 260 may include a payout spool 272 for paying out substrate 212 from a first coil (input roll 274) for receipt at a first end 276 of isolation zone 220, vessel 230, precursor zone 214, or radicals zone 216. The substrate transport mechanism 260 may further include a take-up spool 282 for receiving the coated substrate 212 from a second end 284 of isolation zone 220, vessel 230, precursor zone 214, or radicals zone 216 opposite first end 276, and coiling the substrate 212 into a take-up roll 286 or second coil. Payout spool 272 and/or take-up spool 282 may be located within vessel 230, such as within isolation zone 220. Alternatively, payout and take-up spools 272, 282 may be located outside of vessel 230, i.e., outside of isolation zone 220, precursor zone 214, and radicals zone 216 (not shown).

Other embodiments of a web coating system are described in the '786 and '421 applications, and can be readily modified to include a radical generation device for utilizing methods according to the present disclosure.

EXAMPLE

For ALD growth of cobalt (Co) thin film, equipment of FIGS. 4-5 may be employed as follows:

Substrate: silicon wafer, p-type (100);
Operating temperature of reaction space (i.e. substrate temperature)=200° C.;
Operating pressure of reaction space=1 Torr;
Purge gas: forming gas mixture of 4% hydrogen ($H_2$) and balance helium (He) at 100° C. and flow rate of 1 standard liter per minute (slm);
Precursor: dicobalt octacarbonyl ($Co_2(CO)_8$) delivered via a bubbler source at 25° C. utilizing helium (He) carrier gas at 10 standard cubic centimeters (sccm);
Radicals generator: in-situ DC plasma generator operating at 500 watts (or up to 1500 watts); and
Substrate rotation: 10 rpm.

Of course, many other process chemistries and processing conditions may be employed. For example, the systems and methods disclosed herein may be suitable for use with process chemistries disclosed by Sherman (U.S. Pat. No. 6,616,986 B2) and Sneh (U.S. Pat. No. 6,200,893 B1)

It will be obvious to those having skill in the art that many changes may be made to the details of the above-described embodiments without departing from the underlying principles of the invention. The scope of the present invention should, therefore, be determined only by the following claims.

The invention claimed is:

1. A method for depositing a thin film on a substrate, comprising:
    establishing a continuous flow of a purge gas through a reaction chamber;
    maintaining a gaseous reactive radical species in a radicals zone within the reaction chamber while introducing a precursor gas into a precursor zone within the reaction chamber, the precursor zone being spaced apart from the radicals zone to define a deactivation zone therebetween, the purge gas flowing through the radicals zone, the deactivation zone, and the precursor zone such that flow and pressure conditions within the reaction chamber substantially prevent the precursor gas from flowing into the radicals zone and cause the radical species to flow from the radical zone and into the deactivation zone;
    deactivating the radical species in the deactivation zone to form a deactivated species therefrom and to substantially prevent the reactive radical species from mixing with the precursor gas, at least some of the deactivated species flowing into the precursor zone; and
    alternately transporting a substrate between the radicals zone and the precursor zone repeatedly to thereby alternately expose the substrate to the radical species and the precursor gas multiple times, each exposure of the substrate to the precursor gas resulting in some of the precursor gas adsorbing on the substrate as an adsorbed precursor, and each subsequent exposure of the substrate to the radical species resulting in some of the radical species converting at least a portion of the adsorbed precursor to an element or compound, whereby a thin film is formed on the substrate.

2. The method of claim 1, wherein the purge gas is nonreactive with the precursor gas.

3. The method of claim 1, wherein the radical species is generated in-situ continuously by applying energy to the purge gas in the vicinity of the radicals zone.

4. The method of claim 3, wherein the radical species is generated by exposing purge gas to a steady-state UV light in the vicinity of the radicals zone.

5. The method of claim 3, wherein the radical species is generated by igniting a plasma from purge gas in the vicinity of the radicals zone.

6. The method of claim 5, wherein the plasma is ignited by a steady-state DC generator.

7. The method of claim 1, wherein the purge gas flows through the reaction chamber along a flow path extending through the radicals zone, the deactivation zone is located generally downstream in the flow path relative to the radicals zone, and the precursor zone is located generally downstream in the flow path relative to the deactivation zone.

8. The method of claim 7, wherein the radical species are generated by a radical generator that extends into the flow path and the precursor gas is injected into the flow path leeward of the radical generator.

9. The method of claim 1, wherein a continuous flow of the precursor gas is injected into the precursor zone.

10. The method of claim 1, further comprising pumping from the reaction chamber to create a vacuum therein.

11. The method of claim 1, wherein the transporting of the substrate includes moving the substrate along a circular transport path.

12. The method of claim 1, wherein the maintaining of the radical species includes generating the radical species remotely of the radicals zone and injecting the radical species into the radicals zone.

13. The method of claim 1, wherein the radical species comprises hydrogen radicals and the precursor gas comprises a metal-containing molecule.

14. The method of claim 1, wherein deactivating the radical species includes contacting the radical species in the deactivation zone with an active radicals deactivation device.

15. The method of claim 1, further comprising:
    introducing a second precursor gas into the reaction chamber at a second precursor zone; and
    transporting the substrate along a transport path that extends into the second precursor zone.

16. The method of claim 1, further comprising maintaining a second gaseous radical species within the reaction chamber.

17. The method of claim 1, wherein each exposure of the substrate to the precursor gas results in self-limiting, saturating adsorption of precursor gas on the substrate as adsorbed precursor.

18. The method of claim 1, wherein the thin film is deposited by atomic layer deposition.

19. The method of claim 1, wherein the thin film consists essentially of a non-semiconductor material.

20. The method of claim 1, wherein the thin film consists essentially of a metal.

* * * * *

UNITED STATES PATENT AND TRADEMARK OFFICE
CERTIFICATE OF CORRECTION

| | | |
|---|---|---|
| PATENT NO. | : 8,187,679 B2 | Page 1 of 1 |
| APPLICATION NO. | : 11/829050 | |
| DATED | : May 29, 2012 | |
| INVENTOR(S) | : Dickey et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 817 days.

Signed and Sealed this
Sixteenth Day of September, 2014

Michelle K. Lee
*Deputy Director of the United States Patent and Trademark Office*